(12) United States Patent
Zheng et al.

(10) Patent No.: US 11,243,572 B2
(45) Date of Patent: Feb. 8, 2022

(54) FLEXIBLE DISPLAY SUBSTRATE, METHOD FOR MANUFACTURING THE SAME AND FLEXIBLE DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hai Zheng, Beijing (CN); Sangwon Lee, Beijing (CN); Yao Huang, Beijing (CN); Gaoxiang Wu, Beijing (CN); Haitong Ran, Beijing (CN); Jiacheng Li, Beijing (CN); Fushi Jin, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/843,245

(22) Filed: Apr. 8, 2020

(65) Prior Publication Data

US 2021/0048851 A1 Feb. 18, 2021

(30) Foreign Application Priority Data

Aug. 12, 2019 (CN) .......................... 201910741619.0

(51) Int. Cl.
*G06F 1/16* (2006.01)
*G02B 1/14* (2015.01)
*G06F 1/18* (2006.01)

(52) U.S. Cl.
CPC ............. *G06F 1/1652* (2013.01); *G02B 1/14* (2015.01); *G06F 1/189* (2013.01)

(58) Field of Classification Search
CPC .......... G06F 1/1652; G06F 1/189; G02B 1/14
(Continued)

(56) References Cited

U.S. PATENT DOCUMENTS

2018/0033979 A1* 2/2018 Jang .......................... B32B 3/08
2018/0374879 A1 12/2018 Jeon et al.
(Continued)

FOREIGN PATENT DOCUMENTS

CN 102651344 A 8/2012
CN 109065583 A 12/2018
(Continued)

OTHER PUBLICATIONS

Office Action dated Mar. 31, 2021 in CN Application No. 201910741619.0, 22 pages.

*Primary Examiner* — Charles S Chang
(74) *Attorney, Agent, or Firm* — Muncy, Geissler, Olds & Lowe, P.C.

(57) ABSTRACT

A flexible display substrate, a method for manufacturing the same, and a flexible display device are provided. The flexible display substrate includes a display region, an electrode bonding region, and a bending region between the electrode bonding region and the display region. The method includes: forming an inorganic film layer on the flexible display substrate, forming a first via hole penetrating the inorganic film layer in the bending region by using a single patterning process, where a sidewall of the first via hole is step-shaped, the inorganic film layer includes at least one of the following film layers: a barrier layer, a buffer layer, a first gate insulation layer, a second gate insulation layer and an interlayer insulation layer.

6 Claims, 2 Drawing Sheets

(58) Field of Classification Search
USPC .......................................................... 349/187
See application file for complete search history.

(56) References Cited

U.S. PATENT DOCUMENTS

2019/0019819 A1  1/2019  Shim et al.
2020/0161570 A1  5/2020  Bai et al.

FOREIGN PATENT DOCUMENTS

| CN | 109300840 A | 2/2019 |
| CN | 109560087 A | 4/2019 |

\* cited by examiner

FLEXIBLE DISPLAY SUBSTRATE, METHOD FOR MANUFACTURING THE SAME AND FLEXIBLE DISPLAY DEVICE

CROSS-REFERENCE TO RELATED APPLICATION

This application claims a priority to Chinese Patent Application No. 201910741619.0 filed in China on Aug. 12, 2019, the disclosure of which is incorporated in its entirety by reference herein.

TECHNICAL FIELD

The present disclosure relates to the field of display technologies, in particular to a flexible display substrate, a method for manufacturing the flexible display substrate and a flexible display device.

BACKGROUND

A flexible display substrate in the related art is divided into a display region and an electrode bonding region. In order to realize a narrow bezel of the flexible display device, a portion of the flexible display substrate corresponding to the electrode bonding region is bent into facing away from a display surface, and a bending region is located between the display region and the electrode bonding region. There is still latitude for improvement in display panel manufacturing processes.

SUMMARY

The present disclosure provides, in some embodiments, a method for manufacturing a flexible display substrate including a display region, an electrode bonding region, and a bending region between the electrode bonding region and the display region. The method includes: forming an inorganic film layer on the flexible display substrate, forming a first via hole penetrating the inorganic film layer in the bending region by using a single patterning process, where a sidewall of the first via hole is step-shaped, the inorganic film layer includes at least one of the following film layers: a barrier layer, a buffer layer, a first gate insulation layer, a second gate insulation layer and an interlayer insulation layer.

Further, the forming the first via hole penetrating the inorganic film layer in the bending region by using a single patterning process includes:

coating a photoresist on the inorganic film layer, exposing, by using a half-tone mask, and developing the photoresist to form a photoresist remaining region, a photoresist partially-remaining region, and a photoresist fully-removed region, where the photoresist partially-remaining region corresponds to a step-shaped face of the first via hole, the photoresist fully-removed region corresponds to a region of the first via hole other than the step-shaped face, the photoresist remaining region corresponds to a region other than the first via hole, the step-shaped face is a portion of the sidewall of the first via hole that is parallel to a base substrate of the flexible display substrate;

etching the inorganic film layer in the photoresist fully-removed region to remove all of the inorganic film layer in the photoresist fully-removed region, so as to form a first transition via hole;

ashing off the photoresist in the photoresist partially-remaining region; and etching the inorganic film layer in the photoresist partially-remaining region to remove a part of the inorganic film layer in the photoresist partially-remaining region, so as to form the first via hole.

Further, the all of the inorganic film layer includes the barrier layer, the buffer layer, the first gate insulation layer, the second gate insulation layer and the interlayer insulation layer; the part of the inorganic film layer includes the first gate insulation layer, the second gate insulation layer and the interlayer insulation layer.

Further, the method includes: forming at least one second via hole in the display region by using a same patterning process as the patterning process in which the first via hole is formed.

Further, the second via hole includes a gate metal layer connection via hole revealing a gate metal layer pattern and a source-drain metal layer connection via hole revealing a source-drain metal layer pattern.

Further, prior to the forming the first via hole and the second via hole, the method includes:

providing a flexible base substrate;
forming the barrier layer on the flexible base substrate;
forming the buffer layer on the barrier layer;
forming an active layer and the source-drain metal layer pattern on the buffer layer;
forming the first gate insulation layer covering the active layer and the source-drain metal layer pattern;
forming the gate metal layer pattern on the first gate insulation layer;
forming the second gate insulation layer covering the gate metal layer pattern; and
forming the interlayer insulation layer.

Further, the forming the first via hole and the second via hole by using the same patterning process includes:

coating a photoresist on the interlayer insulation layer;
exposing, by using a half-tone mask, and developing the photoresist to form a photoresist remaining region, a photoresist partially-remaining region, and a photoresist fully-removed region, where the photoresist partially-remaining region corresponds to a step-shaped face of the first via hole, the photoresist fully-removed region includes a first region corresponding to the gate metal layer connection via hole, a second region corresponding to the source-drain metal layer connection via hole and a third region corresponding to a region of the first via hole other than the step-shaped face, the photoresist remaining region corresponds to a region other than the first via hole and the second via hole, the step-shaped face is a portion of the sidewall of the first via hole that is parallel to the base substrate of the flexible display substrate;

removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern, and removing the interlayer insulation layer, the second gate insulation layer, the first gate insulation layer, the buffer layer and the barrier layer in the third region to form a first transition via hole by using a dry-etching process;

ashing off the photoresist in the photoresist partially-remaining region; and removing the interlayer insulation layer, the second gate insulation layer and the first gate insulation layer in the photoresist partially-remaining region by using a dry-etching process to form the first via hole.

Further, the removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern by using the dry-etching process includes:

removing the interlayer insulation layer and the second gate insulation layer in the first region to form the gate metal layer connection via hole revealing the gate metal layer pattern and removing the interlayer insulation layer, the second gate insulation layer and the first gate insulation layer in the second region to form the source-drain metal layer connection via hole revealing the source-drain metal layer pattern by using the dry-etching process and different size design values of the gate metal layer connection via hole and the source-drain metal layer connection via hole, where the size design value of the gate metal layer connection via hole is less than the size design value of the source-drain metal layer connection via hole.

Further, subsequent to the forming the interlayer insulation layer and prior to the coating the photoresist on the interlayer insulation layer, the method further includes:

performing an activation treatment on the interlayer insulation layer.

Further, subsequent to the forming the first via hole and the second via hole, the method further includes:

performing a heat treatment on the interlayer insulation layer.

The present disclosure further provides, in some embodiments, a flexible display substrate manufactured by using the method described above. The flexible display substrate includes: the display region, the electrode bonding region, and the bending region between the electrode bonding region and the display region, where the bending region is provided with the first via hole penetrating the inorganic film layer of the flexible display substrate, the sidewall of the first via hole is step-shaped, the inorganic film layer includes at least one of the following film layers: the barrier layer, the buffer layer, the first gate insulation layer, the second gate insulation layer and the interlayer insulation layer.

Further, the inorganic film layer includes the barrier layer, the buffer layer, the first gate insulation layer, the second gate insulation layer and the interlayer insulation layer sequentially formed on a base substrate, the first via hole includes a step-shaped face which is a portion of the sidewall of the first via hole that is parallel to the base substrate, the first gate insulation layer, the second gate insulation layer and the interlayer insulation layer on a side of the step-shaped face that is away from the base substrate are removed, and the barrier layer and the buffer layer between the step-shaped face and the base substrate are not removed.

The present disclosure further provides, in some embodiments, a flexible display device including the flexible display substrate described above.

DETAILED DESCRIPTION

In order to make problems to be solved, technical solutions and advantages of the embodiments of the present disclosure clearer, a detail description will be given hereinafter with reference to the accompanying drawings and specific embodiments.

A flexible display substrate in the related art is divided into a display region and an electrode bonding region. In order to realize a narrow bezel of the flexible display device, a portion of the flexible display substrate corresponding to the electrode bonding region is bent into facing away from a display surface, and a bending region is located between the display region and the electrode bonding region. In order to release a stress generated by an inorganic film layer in the bending region during the process of bending, a via hole penetrating the inorganic film layer is provided in the bending region. In the related art, to prevent an excessive level difference at the via hole from negatively affecting an electrical connection between the display region and the electrode bonding region, a via hole having a step-shaped structure is formed by multiple patterning processes, which, however, increases the number of patterning processes required for manufacturing the flexible display substrate, and increases time and costs for manufacturing the flexible display substrate.

Figure 1:
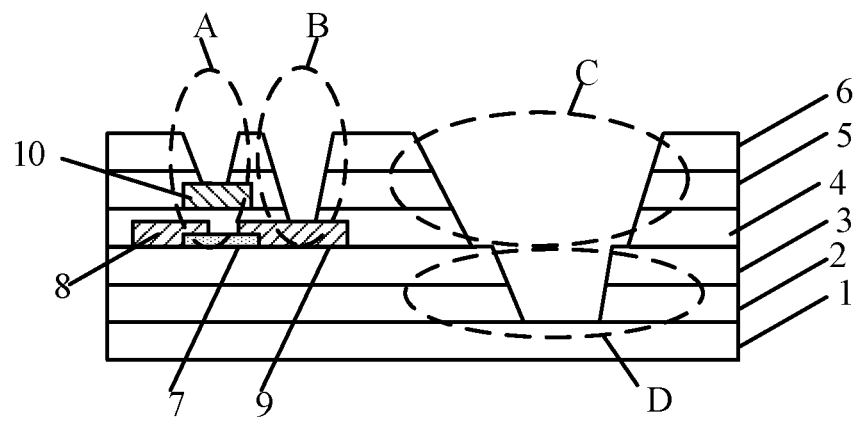
FIG. 1 is a schematic structural diagram of a flexible display substrate according to some embodiments of the present disclosure.

Specifically, as shown in FIG. 1, the via hole having the step-shaped structure in the flexible display substrate is composed of a via hole C and a via hole D. Additionally, a via hole A penetrating a second gate insulation layer 5 and an interlayer insulation layer 6 is provided in the display region. A gate electrode 10 is revealed by the via hole A, and is connected to a conductive layer via the via hole A to receive a gate signal. A via hole B penetrating the second gate insulation layer 5, a first gate insulation layer 4 and the interlayer insulation layer 6 is further provided in the display region. A drain electrode region 9 is revealed by the via hole B. A source electrode region 8 and the drain electrode region 9 are connected to the conductive layer via the via hole B to receive a source electrode signal and a drain electrode signal respectively.

A process in the related art of manufacturing the via hole A, the via hole B, the via hole C and the via hole D includes the following steps.

Step 1, performing an activation treatment on the interlayer insulation layer 6 after the interlayer insulation layer 6 is formed by deposition, which may improve the performance of the interlayer insulation layer 6.

Step 2, coating a photoresist on the interlayer insulation layer 6, and exposing, by using a mask for manufacturing the via hole C, and developing the photoresist to forming a photoresist remaining region and a photoresist removed region, etching the first gate insulation layer 4, the second gate insulation layer 5 and the interlayer insulation layer 6 in the photoresist removed region to form the via hole C, and stripping the remaining photoresist.

Step 3, coating a photoresist on the interlayer insulation layer 6 and an revealed buffer layer 3, exposing and developing the photoresist to form a photoresist remaining region and a photoresist removed region, the photoresist removed region corresponding to the via hole D, etching the buffer layer 3 and a barrier layer 2 in the photoresist removed region to form the via hole D, and stripping the remaining photoresist.

Step 4, coating a photoresist on the interlayer insulation layer 6 and an revealed base substrate 1, exposing and developing the photoresist to form a photoresist remaining region and a photoresist removed region, the photoresist removed region corresponding to the via hole A and the via hole B, etching the interlayer insulation layer 6 in the photoresist removed region to form the via hole A and the via hole B.

It can be seen that, it is required to use three masks and three patterning processes to form the via holes A, B, C, and D in the related art, therefore the number of masks required for manufacturing the flexible display substrates is large, and the number of patterning processes required for manufacturing the flexible display substrate is large, thereby increasing the time and costs for manufacturing the flexible display substrate.

In order to solve the above problems, a flexible display substrate, a method for manufacturing the flexible display substrate, and a flexible display device are provided in the embodiments of the present disclosure, which may reduce the number of the patterning processes required for manufacturing the flexible display substrate, and reduce the time and costs for manufacturing the flexible display substrate.

A method for manufacturing a flexible display substrate is provided in the embodiments of the present disclosure, the flexible display substrate includes a display region, an electrode bonding region, and a bending region between the electrode bonding region and the display region, the method includes: forming an inorganic film layer on the flexible display substrate, forming a first via hole penetrating the inorganic film layer in the bending region by using a single patterning process, where a sidewall of the first via hole is step-shaped, the inorganic film layer includes at least one of the following film layers: a barrier layer, a buffer layer, a first gate insulation layer, a second gate insulation layer and an interlayer insulation layer.

In the embodiment, the first via hole penetrating the inorganic film layer in the bending region and having the step-shaped side wall is formed by using a single patterning process, which may reduce the number of the masks required for manufacturing the flexible display substrate, reduce the number of the patterning processes required for manufacturing the flexible display substrate, and reduce the time and costs for manufacturing the flexible display substrate.

In a specific embodiment, the forming the first via hole penetrating the inorganic film layer in the bending region by using a single patterning process includes: coating a photoresist on the inorganic film layer, exposing, by using a half-tone mask, and developing the photoresist to form a photoresist remaining region, a photoresist partially-remaining region, and a photoresist fully-removed region, where the photoresist partially-remaining region corresponds to a step-shaped face of the first via hole, the photoresist fully-removed region corresponds to a region of the first via hole other than the step-shaped face, the photoresist remaining region corresponds to a region other than the first via hole, the step-shaped face is a portion of the sidewall of the first via hole that is parallel to a base substrate of the flexible display substrate.

The half-tone mask includes a partially light-transmitting pattern corresponding to the step-shaped face of the first via hole and a light-transmitting pattern corresponding to a region of the first via hole other than the step-shaped face.

Further, subsequent to the forming the photoresist remaining region, the photoresist partially-remaining region and the photoresist fully-removed region, the method further includes: etching the inorganic film layer in the photoresist fully-removed region to remove all of the inorganic film layer in the photoresist fully-removed region to form a first transition via hole; ashing off the photoresist in the photoresist partially-remaining region; and etching the inorganic film layer in the photoresist partially-remaining region to remove a part of the inorganic film layer in the photoresist partially-remaining region, so as to form the first via hole.

The all of the inorganic film layer includes the barrier layer, the buffer layer, the first gate insulation layer, the second gate insulation layer and the interlayer insulation layer; and the part of the inorganic film layer includes the first gate insulation layer, the second gate insulation layer and the interlayer insulation layer.

Further, at least one second via hole is formed in the display region by using a same patterning process as the patterning process in which the first via hole is formed. Thus, the number of the masks required for manufacturing the flexible display substrate may be further reduced, the number of the patterning processes required for manufacturing the flexible display substrate may be further reduced, thereby reducing the time and costs for manufacturing the flexible display substrate.

Specifically, the second via hole includes a gate metal layer connection via hole revealing a gate metal layer pattern and a source-drain metal layer connection via hole revealing a source-drain metal layer pattern. The forming the second via hole includes: forming the gate metal layer connection via hole revealing the gate metal layer pattern and the source-drain metal layer connection via hole revealing the source-drain metal layer pattern.

Further, prior to the forming the first via hole and the second via hole, the method includes: providing a flexible base substrate; forming the barrier layer on the flexible base substrate; forming the buffer layer on the barrier layer; forming an active layer and the source-drain metal layer pattern on the buffer layer; forming the first gate insulation layer covering the active layer and the source-drain metal layer pattern; forming the gate metal layer pattern on the first gate insulation layer; forming the second gate insulation layer covering the gate metal layer pattern; and forming the interlayer insulation layer.

In a specific embodiment, the forming the first via hole and the second via hole by using the same patterning process includes: coating a photoresist on the interlayer insulation layer; exposing, by using a half-tone mask, and developing the photoresist to form a photoresist remaining region, a photoresist partially-remaining region, and a photoresist fully-removed region, where the photoresist partially-remaining region corresponds to a step-shaped face of the first via hole, the photoresist fully-removed region includes a first region corresponding to the gate metal layer connection via hole, a second region corresponding to the source-drain metal layer connection via hole and a third region corresponding to a region of the first via hole other than the step-shaped face, the photoresist remaining region corresponds to a region other than the first via hole and the second via hole, the step-shaped face is a portion of the sidewall of the first via hole that is parallel to the base substrate of the flexible display substrate.

The half-tone mask includes a partially light-transmitting pattern corresponding to the step-shaped face of the first via hole, and a light-transmitting pattern corresponding to the first region corresponding to the gate metal layer connection via hole, the second region corresponding to the source-drain metal layer connection via hole and the third region corresponding to a region of the first via hole other than the step-shaped face.

Further, subsequent to the forming the photoresist remaining region, the photoresist partially-remaining region and the photoresist fully-removed region, the method further includes: removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern, and removing the interlayer insulation layer, the second gate insulation layer, the first gate insulation layer, the buffer layer and the barrier layer in the third region to form a first transition via hole by using a dry-etching process; ashing off the photoresist in the photoresist partially-remaining region; and removing the interlayer insulation layer, the second gate insulation layer and the first gate insulation layer in the photoresist partially-remaining region by using a dry-etching process to form the first via hole.

Further, the removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern by using the dry-etching process includes: removing the interlayer insulation layer and the second gate insulation layer in the first region to form the gate metal layer connection via hole revealing the gate metal layer pattern and removing the interlayer insulation layer, the second gate insulation layer and the first gate insulation layer in the second region to form the source-drain metal layer connection via hole revealing the source-drain metal layer pattern by using the dry-etching process and different size design values of the gate metal layer connection via hole and the source-drain metal layer connection via hole, where the size design value of the gate metal layer connection via hole is less than the size design value of the source-drain metal layer connection via hole.

Further, subsequent to the forming the interlayer insulation layer and prior to the coating the photoresist on the interlayer insulation layer, the method further includes: performing an activation treatment on the interlayer insulation layer.

The performance of the interlayer insulation layer may be improved by performing the activation treatment on the interlayer insulation layer.

Further, subsequent to the forming the first via hole and the second via hole, the method further includes: performing a heat treatment on the interlayer insulation layer.

By performing the heat treatment on the interlayer insulation layer, hydrogen ions in the interlayer insulation layer may move down to the active layer, thereby remedying defects generated in the active layer in the manufacturing process.

The method for manufacturing the flexible display substrate according to the present disclosure is described in detail below with reference to the drawings and specific embodiments. The method for manufacturing the flexible display substrate in this embodiment includes the following steps.

Step 1, providing the base substrate 1, and forming the barrier layer 2, the buffer layer 3, the first gate insulation layer 4, the second gate insulation layer 5, the interlayer insulation layer 6, an active layer 7, the gate metal layer pattern and the source-drain metal layer pattern on the base substrate 1.

The base substrate 1 may be made of a flexible material, e.g., polyimide.

The barrier layer 2 may improve an ability of the flexible display substrate to resist moisture and oxygen.

The buffer layer 3 may be made of an oxide, a nitride, or an oxynitride, and a corresponding reaction gas is $SiH_4$, $NH_3$, $N_2$, or $SiH_2Cl_2$, $NH_3$, $N_2$.

A semiconductor material layer is formed on the buffer layer 3, and is patterned to form the active layer 7.

A source-drain metal layer is formed on the buffer layer 3, and is patterned to form the source-drain metal layer pattern. The source-drain metal layer pattern includes the source electrode region 8 and the drain electrode region 9.

The first gate insulation layer 4 is formed. The first gate insulation layer 4 may be made of an oxide, a nitride, or an oxynitride, and a corresponding reaction gas is $SiH_4$, $NH_3$, $N_2$, or $SiH_2Cl_2$, $NH_3$, $N_2$.

A gate metal layer is formed on the first gate insulation layer 4, and is patterned to form the gate metal layer pattern. The gate metal layer pattern includes the gate electrode 10.

The second gate insulation layer 5 is formed. The second gate insulation layer 5 may be made of an oxide, a nitride, or an oxynitride, and a corresponding reaction gas is $SiH_4$, $NH_3$, $N_2$, or $SiH_2Cl_2$, $NH_3$, $N_2$.

The interlayer insulation layer 6 is formed. The interlayer insulation layer 6 may be made of an oxide, a nitride, or an oxynitride, and a corresponding reaction gas is $SiH_4$, $NH_3$, $N_2$, or $SiH_2Cl_2$, $NH_3$, $N_2$.

Step 2, performing an activation treatment on the interlayer insulation layer 6.

The performance of the interlayer insulation layer 6 may be improved by performing the activation treatment. The activation treatment may be a heat treatment. The heat treatment may rearrange disordered lattices. A temperature of the activation treatment may be 347.5° C.-452.5° C., and an ambient oxygen concentration should be less than 100 ppm.

Figure 2:
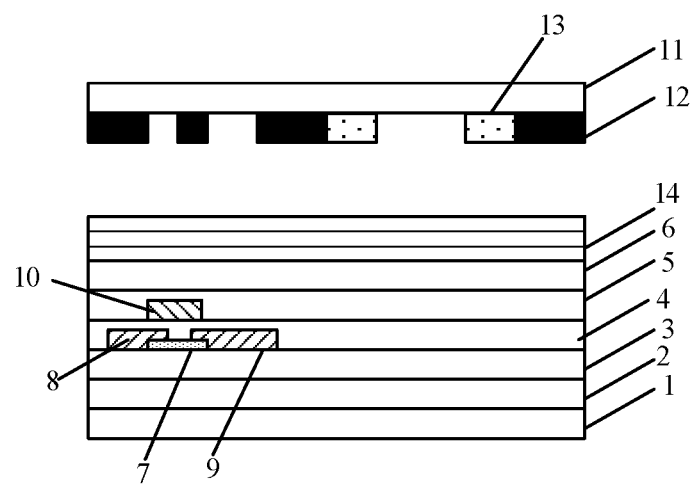
FIG. 2 is a schematic diagram of an operation of coating a photoresist on an interlayer insulation layer and exposing the photoresist by using a mask according to some embodiments of the present disclosure.

Step 3, as shown in FIG. 2, coating a photoresist 14 on the interlayer insulation layer 6, and exposing the photoresist 14 by using a mask.

The mask includes a mask body 11 and a light-proof pattern 12 and a partially light-transmitting pattern 13 on the mask plate body 11

Figure 3:
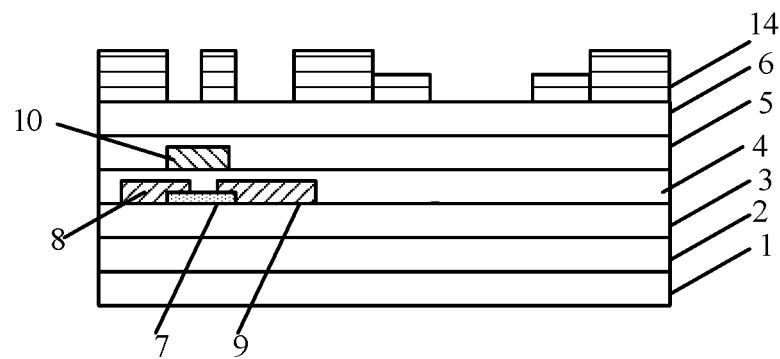
FIG. 3 is a schematic diagram illustrating a state after the photoresist is developed according to some embodiments of the present disclosure.

Step 4, as shown in FIG. 3, developing the photoresist 14 to form a photoresist partially-remaining region, a photoresist fully-remaining region and a photoresist removed region.

The photoresist removed region corresponds to positions of the via holes A, B, and D in FIG. 1, and the photoresist partially-remaining region corresponds to a step-shaped face between the via holes C and D in FIG. 1.

Figure 4:
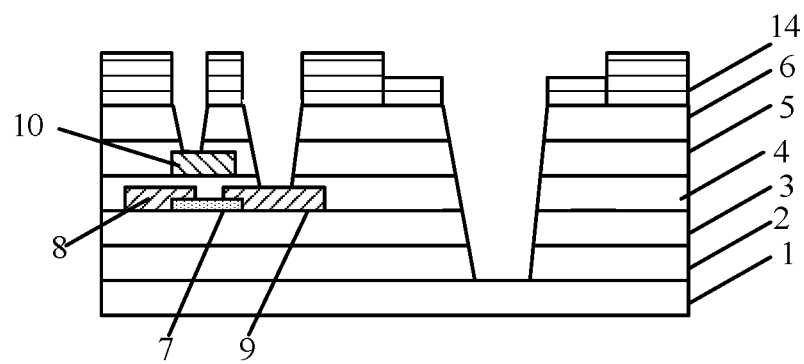
FIG. 4 is a schematic diagram of an operation of etching a film layer in a photoresist removed region according to some embodiments of the present disclosure.

Step 5, as shown in FIG. 4, etching an insulation film layer in the photoresist removed region, to form a via hole revealing the gate electrode 10 (i.e., the via hole A), a via hole revealing the drain electrode region 9 (i.e., the via hole B), and a via hole revealing the base substrate 1. The gate electrode 10 is connected to the conductive layer through the via hole A to receive the gate signal; the source electrode region 8 and the drain electrode region 9 are connected to the conductive layer through the via hole B to receive the source electrode signal and the drain electrode signal respectively.

Figure 5:
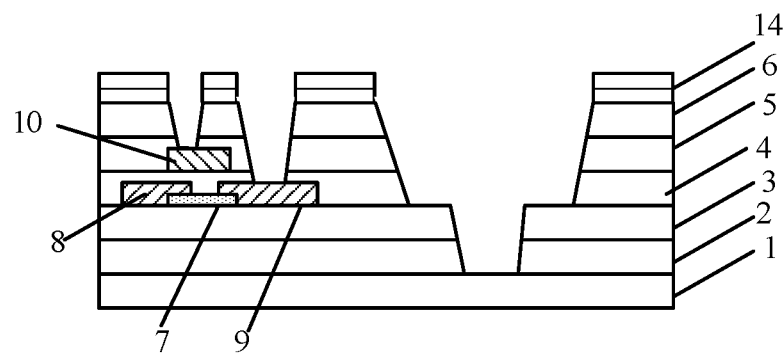
FIG. 5 is a schematic diagram of an operation of etching a film layer in a photoresist partially-remaining region according to some embodiments of the present disclosure.

Step 6, as shown in FIG. 5, ashing off the photoresist in the photoresist partially-remaining region; and etching the first gate insulation layer 4, the second gate insulation layer 5 and the interlayer insulation layer 6 in the photoresist partially-remaining region to form a via hole with a step-shaped sidewall in the bending region.

Then the remaining photoresist 14 is stripped to obtain the flexible display substrate as shown in FIG. 1.

In this embodiment, by forming the via holes in the display region and the via hole in the bending region in a single patterning process, only one mask is required, which may reduce the number of the masks required for manufacturing the flexible display substrate, the number of the patterning processes required for manufacturing the flexible display substrate, and the time and costs for manufacturing the flexible display substrate.

After the photoresist is stripped, a heat treatment may be performed on the interlayer insulation layer 6. The heat treatment may cause the hydrogen ions in the interlayer insulation layer 6 to diffuse down into the active layer 7, so as to passivate and repair dangling bonds and traps in the active layer 7 with hydrogen bonds, thereby improving a stability of a thin film transistor. A temperature of the heat treatment may be 347.5° C.-402.5° C., and an ambient oxygen concentration should be less than 100 ppm.

After exposing the photoresist on the interlayer insulation layer by using the mask, the photoresist removed region corresponds to the positions of the via holes A, B and D in FIG. 1, however, depths of the via holes A, B and D are different. For example, in order to form the via hole A, the second gate insulation layer 5 and the interlayer insulation layer 6 are to be etched; in order to form the via hole B, the first gate insulation layer 4, the second gate insulation layer 5 and the interlayer insulation layer 6 are to be etched; in order to form the via hole D, the barrier layer 2, the buffer layer 3, the first gate insulation layer 4, the second gate insulation layer 5 and the interlayer insulation layer 6 are to be etched. In order to prevent the gate electrode 10 and the drain electrode region 9 from being over-etched during the etching process, it is necessary to adopt different size design values for the via hole A and the via hole B in a design process to balance the etching process. The designed sizes of the via hole A and the via hole B should follow a rule that a size of the via hole A is less than a size of the via hole B. Generally, a diameter of the via hole A may be less than a diameter of the via hole B by 0.2 um.

The present disclosure further provides, in some embodiments, a flexible display substrate manufactured by using the method described above. The flexible display substrate includes: the display region, the electrode bonding region and the bending region between the electrode bonding region and the display region, where the bending region is provided with the first via hole penetrating the inorganic film layer of the flexible display substrate, the sidewall of the first via hole is step-shaped, the inorganic film layer includes at least one of the following film layers: the barrier layer, the buffer layer, the first gate insulation layer, the second gate insulation layer and the interlayer insulation layer.

In a specific embodiment, as shown in FIG. 5, the inorganic film layer includes the barrier layer 2, the buffer layer 3, the first gate insulation layer 4, the second gate insulation layer 5 and the interlayer insulation layer 6. The step-shaped face of the first via hole is the portion of the sidewall of the first via hole that is parallel to the base substrate 1 of the flexible display substrate. The first gate insulation layer 4, the second gate insulation layer 5, and the interlayer insulation layer 6 on a side of the step-shaped face that is away from the base substrate 1 are removed, and the barrier layer 2 and the buffer layer 3 between the step-shaped face and the base substrate 1 are not removed, thus a step-shaped structure is formed.

The present disclosure further provides, in some embodiments, a flexible display device including the flexible display substrate described above. The flexible display substrate includes: the display region, the electrode bonding region and the bending region between the electrode bonding region and the display region, where the bending region is provided with the first via hole penetrating the inorganic film layer of the flexible display substrate, the sidewall of the first via hole is step-shaped, the inorganic film layer includes at least one of the following film layers: the barrier layer, the buffer layer, the first gate insulation layer, the second gate insulation layer and the interlayer insulation layer.

The flexible display device may be any product or component having a display function, such as a television, a display, a digital photo frame, a mobile phone, or a tablet computer. The display device further includes a flexible printed circuit board, a printed circuit board and a back plate.

In the method embodiments of the present disclosure, sequence numbers of the steps are not used to define the sequence of the steps. A change of sequence of the steps made by a person of ordinary skill in the art, without any creative effort, also falls within the scope of the present disclosure.

Unless otherwise defined, technical or scientific terms used in the present disclosure shall have general meanings as understood by a person of ordinary skill in the art. Terms "first", "second" and similar terms in the present disclosure do not indicate any order, quantity or priority, but are used only for distinguishing different components. Terms "include", "have" or similar terms are intended to indicate that elements or objects preceding the term encompass elements or objects following the term or equivalents thereof, without excluding other elements or objects. Term "connecting", "connected" or other similar terms are not limited to physical or mechanical connections, but may include electrical connections, whether direct or indirect. Terms such as "Up", "down", "left", "right" are only intended to represent a relative position relationship. When an absolute position of a described object is changed, the relative position relationship may also be changed accordingly.

It should be appreciated that when an element such as a layer, film, region, or substrate is referred to as being "on" or "under" another element, the element may be "on" or "under" another element directly, or there may be intermediate elements.

The above merely describes optional embodiments of the present disclosure, it should be appreciated that a person of ordinary skill in the art may make modifications and improvements without departing from the principle of the present disclosure, and these modifications and improvements shall also be construed as falling within the scope of the present disclosure.

What is claimed is:

1. A method for manufacturing a flexible display substrate comprising a display region, an electrode bonding region, and a bending region between the electrode bonding region and the display region, comprising:
forming an inorganic film layer on the flexible display substrate;
forming a first via hole penetrating the inorganic film layer in the bending region by using a single patterning process, wherein a sidewall of the first via hole is step-shaped, the inorganic film layer comprises at least one of following film layers: a barrier layer, a buffer layer, a first gate insulation layer, a second gate insulation layer and an interlayer insulation layer;
forming a second via hole in the display region by using a same patterning process as the patterning process in which the first via hole is formed, wherein the second via hole comprises a gate metal layer connection via hole revealing a gate metal layer pattern and a source-drain metal layer connection via hole revealing a source-drain metal layer pattern,
wherein, prior to forming the first via hole and the second via hole, the method further comprises:
providing a flexible base substrate;
forming the barrier layer on the flexible base substrate;
forming the buffer layer on the barrier layer;
forming an active layer and the source-drain metal layer pattern on the buffer layer;
forming the first gate insulation layer covering the active layer and the source-drain metal layer pattern;
forming the gate metal layer pattern on the first gate insulation layer;
forming the second gate insulation layer covering the gate metal layer pattern; and
forming the interlayer insulation layer,
wherein forming the first via hole and the second via hole by using the same patterning process comprises:
coating a photoresist on the interlayer insulation layer;
exposing, by using a half-tone mask, and developing the photoresist to form a photoresist remaining region, a photoresist partially-remaining region, and a photoresist fully-removed region, wherein the photoresist partially-remaining region corresponds to a step-shaped face of the first via hole, the photoresist fully-removed region comprises a first region corresponding to the gate metal layer connection via hole, a second region corresponding to the source-drain metal layer connection via hole and a third region corresponding to a region of the first via hole other than the step-shaped face, the photoresist remaining region corresponds to a region other than the first via hole and the second via hole, the step-shaped face is a portion of the sidewall of the first via hole that is parallel to the base substrate of the flexible display substrate;
removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern, and removing the interlayer insulation layer, the second gate insulation layer, the first gate insulation layer, the buffer layer and the barrier layer in the third region to form a first transition via hole by using a dry-etching process;
ashing off the photoresist in the photoresist partially-remaining region; and removing the interlayer insulation layer, the second gate insulation layer and the first gate insulation layer in the photoresist partially-remaining region by using a dry-etching process to form the first via hole,
wherein the removing the interlayer insulation layer and the second gate insulation layer in the first region to form the gate metal layer connection via hole revealing the gate metal layer pattern, removing the interlayer insulation layer, the second gate insulation layer and the first gate insulation layer in the second region to form the source-drain metal layer connection via hole revealing the source-drain metal layer pattern by using the dry-etching process comprises:
removing the interlayer insulation layer and the second gate insulation layer in the first region to form the gate metal layer connection via hole revealing the gate metal layer pattern and removing the interlayer insulation layer, the second gate insulation layer and the first gate insulation layer in the second region to form the source-drain metal layer connection via hole revealing the source-drain metal layer pattern by using the dry-etching process and different size design values of the gate metal layer connection via hole and the source-drain metal layer connection via hole, and
wherein the size design value of the gate metal layer connection via hole is less than the size design value of the source-drain metal layer connection via hole.

2. The method according to claim 1, wherein, subsequent to the forming the interlayer insulation layer and prior to the coating the photoresist on the interlayer insulation layer, the method further comprises:
performing an activation treatment on the interlayer insulation layer.

3. The method according to claim 1, wherein, subsequent to the forming the first via hole and the second via hole, the method further comprises:
performing a heat treatment on the interlayer insulation layer.

4. A flexible display substrate manufactured by using the method according to claim 1, comprising: the display region, the electrode bonding region, and the bending region between the electrode bonding region and the display region, wherein the bending region is provided with the first via hole penetrating the inorganic film layer of the flexible display substrate, the sidewall of the first via hole is step-shaped, the inorganic film layer comprises at least one of the following film layers: the barrier layer, the buffer layer, the first gate insulation layer, the second gate insulation layer and the interlayer insulation layer.

5. The flexible display substrate according to claim 4, wherein the inorganic film layer comprises the barrier layer, the buffer layer, the first gate insulation layer, the second gate insulation layer and the interlayer insulation layer sequentially formed on a base substrate,
the first via hole comprises a step-shaped face, the step-shaped face is a portion of the sidewall of the first via hole that is parallel to the base substrate,
the first gate insulation layer, the second gate insulation layer and the interlayer insulation layer on a side of the step-shaped face that is away from the base substrate are removed, and the barrier layer and the buffer layer between the step-shaped face and the base substrate are not removed.

6. A flexible display device, comprising the flexible display substrate according to claim 4.

* * * * *